US006660607B2

(12) United States Patent
Jagannathan

(10) Patent No.: US 6,660,607 B2
(45) Date of Patent: Dec. 9, 2003

(54) METHOD FOR FABRICATING HETEROJUNCTION BIPOLAR TRANSISTORS

(75) Inventor: Basanth Jagannathan, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/822,587

(22) Filed: Mar. 30, 2001

(65) Prior Publication Data

US 2002/0139996 A1 Oct. 3, 2002

(51) Int. Cl.[7] .............................................. H01L 21/331
(52) U.S. Cl. ...................... 438/309; 438/312; 438/317
(58) Field of Search ................................ 438/235, 317, 438/309, 312

(56) References Cited

U.S. PATENT DOCUMENTS

| | | |
|---|---|---|
| 5,008,207 A | 4/1991 | Blouse et al. |
| 5,202,284 A | 4/1993 | Kamins et al. |
| 5,494,836 A | 2/1996 | Imai |
| 5,506,427 A | 4/1996 | Imai |
| 5,534,713 A | 7/1996 | Ismail et al. |
| 5,633,179 A | 5/1997 | Kamins et al. |
| 5,656,514 A | 8/1997 | Ahlgren et al. |
| 5,798,277 A | 8/1998 | Ryum et al. |
| 6,455,364 B1 * | 9/2002 | Asai et al. |
| 6,504,231 B2 * | 1/2003 | Kato |
| 6,521,974 B1 * | 2/2003 | Oda et al. |
| 6,534,781 B2 * | 3/2003 | Dennison |

FOREIGN PATENT DOCUMENTS

| | | |
|---|---|---|
| EP | 0 507 454 A1 | 5/1992 |
| EP | 0 779 652 A3 | 8/1997 |

* cited by examiner

Primary Examiner—Kevin M. Picardat
(74) Attorney, Agent, or Firm—Tiffany Townsend; Cantor Colburn LLP

(57) ABSTRACT

A method for fabricating a heterojunction bipolar transistor having collector, base and emitter regions is disclosed. In an exemplary embodiment of the invention, the method includes forming a silicon epitaxial layer upon a substrate, the silicon epitaxial layer defining the collector region. An oxide stack is formed upon the silicon epitaxial layer and a nitride layer is then formed upon the oxide stack. Next, an emitter opening is defined within the nitride layer before a base cavity is formed within the oxide stack. The base cavity extends laterally beyond the width of the emitter opening. A silicon-germanium epitaxial layer is grown within the base cavity, the silicon-germanium epitaxial layer defining the base region. Finally, a polysilicon layer is deposited upon said silicon-germanium epitaxial layer, the polysilicon layer defining the emitter region.

25 Claims, 5 Drawing Sheets

METHOD FOR FABRICATING HETEROJUNCTION BIPOLAR TRANSISTORS

BACKGROUND

The present invention relates generally to semiconductor devices and, more particularly, to heterojunction bipolar transistors and methods of manufacturing the same.

With advances in high-speed communications and digital signal processing, there is a corresponding need for improved bipolar transistor characteristics. For example, in order to obtain the highest possible unity-gain cutoff frequency, the base region of the transistor should be as thin as possible. On the other hand, the highest possible frequency of oscillation is achieved when the base resistance is as small as possible. For a bipolar transistor, these requirements are at odds with one another because the base resistance thereof increases as its thickness decreases.

Silicon-germanium (SiGe) heterojunction bipolar transistors (HBT) provide significant leverage in the fabrication of npn transistors with low intrinsic base resistance. This is largely due to the fact that the base doping in an HBT transistor (e.g., with boron) can be increased without degrading the emitter injection efficiency. Furthermore, boron diffusion in SiGe is lower than in silicon, thereby resulting in transistors that are highly doped but with thin basewidths. However, existing HBT fabrication technology does present certain process integration problems. For instance, a low temperature epitaxial Si/SiGe layer is typically the first layer grown after an active area is defined for a transistor. Once formed, the Si/Ge layer is subsequently subjected to multiple thermal cycles and dopant implantation during the formation steps of the remaining elements of the transistor such as the deposition of oxide layers, nitride layers and the emitter. As a result, a doped base layer (e.g., with boron) is subjected to unnecessary diffusion which may ultimately cause an increased basewidth, even if the as-grown base layer is thin.

BRIEF SUMMARY

The above discussed and other drawbacks and deficiencies of the prior art are overcome or alleviated by a method for fabricating a heterojunction bipolar transistor having collector, base and emitter regions. In an exemplary embodiment of the invention, the method includes forming a silicon epitaxial layer upon a substrate, the silicon epitaxial layer defining the collector region. An oxide stack is formed upon the silicon epitaxial layer and a nitride layer is then formed upon the oxide stack. Next, an emitter opening is defined within the nitride layer before a base cavity is formed within the oxide stack. The base cavity extends laterally beyond the width of the emitter opening. A silicon-germanium epitaxial layer is grown within the base cavity, the silicon-germanium epitaxial layer defining the base region. Finally, a polysilicon layer is deposited upon said silicon-germanium epitaxial layer, the polysilicon layer defining the emitter region.

In a preferred embodiment, the base cavity is formed after the oxide stack and the nitride layer have been formed. In addition, a collector dopant material is ionically implanted into the collector region, prior to growing the silicon germanium epitaxial layer within said base cavity. Extrinsic base regions, comprising areas of the base region which extend laterally beyond the width of said emitter opening, are formed by removing portions of the oxide stack and the nitride layer. Then, boron is ionically implanted into the base region, following the formation of the extrinsic base regions.

BRIEF DESCRIPTION OF THE DRAWINGS

Referring to the exemplary drawings wherein like elements are numbered alike in the several Figures.

DETAILED DESCRIPTION

Figure 1:
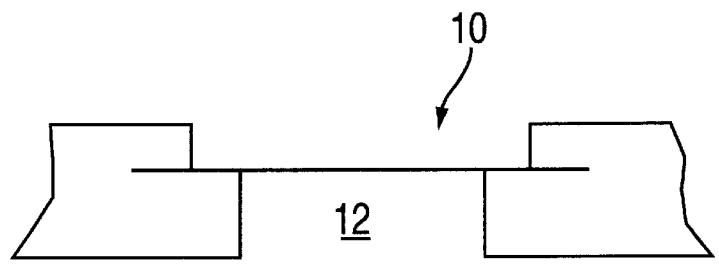
FIGS. 1 through 6 are cross-sectional views illustrating an existing process for the formation of a heterojunction bipolar transistor.
Figure 2:
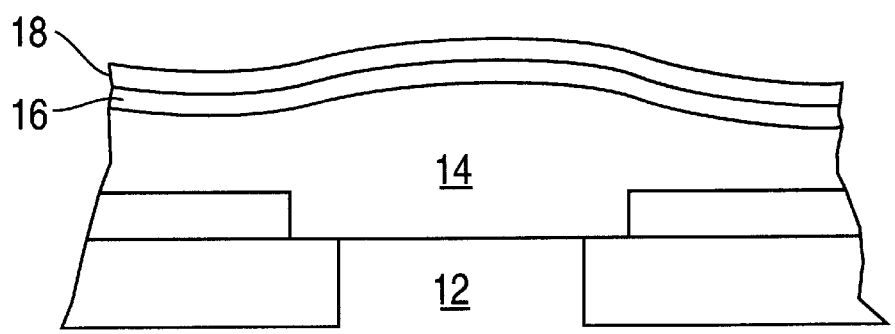

FIGS. 1 through 6 illustrate an existing process for fabricating a heterojunction bipolar transistor within an active area 10 of a substrate 12. As shown in FIG. 2, a silicon film 14 is first grown within the active area 10 of substrate 12, in which a collector region is eventually defined. Then, a boron-doped silicon-germanium (SiGe) layer 16 is grown on the silicon film 14 immediately thereafter, thereby forming a heterojunction between the SiGe layer 16 and the Si film 14. The base region of the transistor is eventually defined within the SiGe layer 16.

Figure 3:
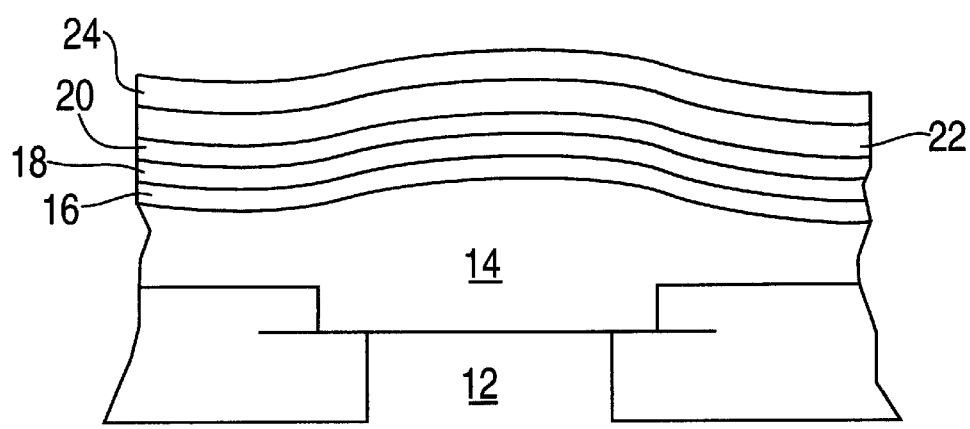

A pure silicon cap 18 is then grown atop the SiGe layer 16 so that a high-pressure oxidation layer (HIPOX) 20 may be formed on the cap, as shown in FIG. 3. Then, a nitride layer 22 is formed upon the HIPOX layer, after which another oxide layer 24, typically a tetraethoxysilane (TEOS) layer is then deposited.

Figure 4:
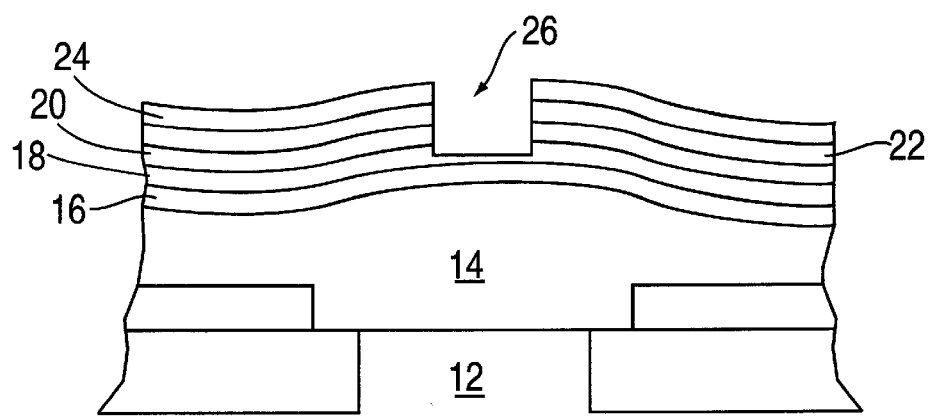
Figure 5:
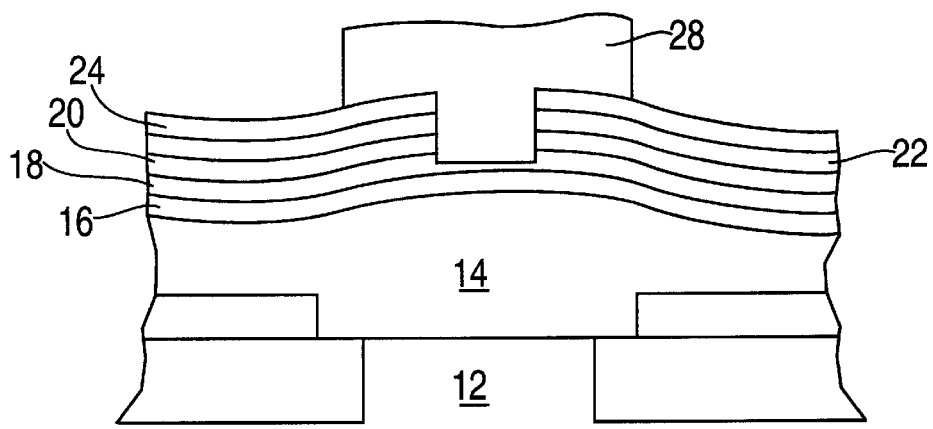
Figure 6:
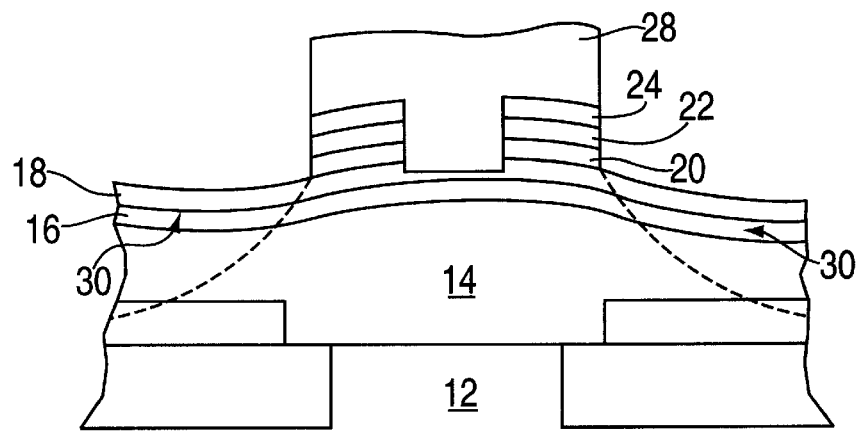

Referring to FIG. 4, in order to form the emitter region, a targeted area of the TEOS 24 and nitride layers 22 are removed by a vertically oriented type etching technique, such as a reactive ion etch (RIE), thereby producing an emitter opening 26. The emitter opening 26 is completed after a wet etch of the HIPOX layer 20, during which a portion of the silicon cap 18 is consumed. It should also be noted that the emitter opening 26 is first patterned with a photoresist material (not shown). Before an emitter is deposited within the emitter opening 26, the self-aligned collector doping is typically performed by ion implantation, the implantation also penetrating (and thus damaging) the SiGe base layer 16. Then, the polysilicon emitter 28 may be deposited within emitter opening 26, as shown in FIG. 5. Finally, once emitter 28 is deposited, the oxide 20, 24 and nitride 22 layers are patterned and etched away, exposing extrinsic base areas 30 which are then ionically implanted with boron.

It will be appreciated that the SiGe layer 16, being formed early on in the above described existing process, is subjected to several thermal cycles resulting from the HIPOX 20, TEOS 24 and nitride 22 layer depositions. In addition, the collector ion implantation is also performed through the boron doped base regions. Thus, as stated earlier, the combined effects of the thermal annealing cycles and ion implantation result in undesired boron diffusion and large basewidths in the base region.

Figure 7:
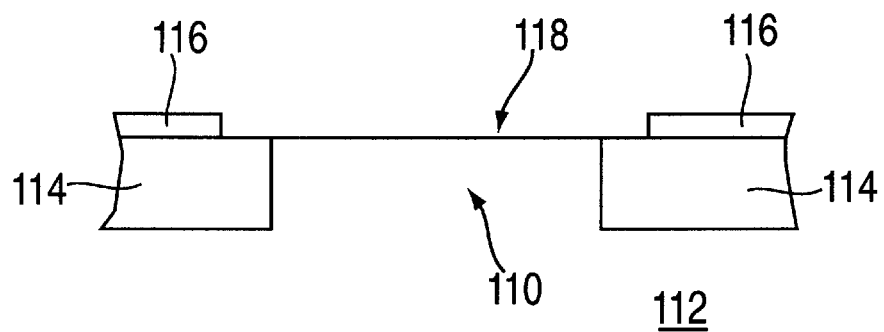
FIG. 7 illustrates a cross-sectional view of an active area for the formation of a heterojunction bipolar transistor having collector, base and emitter regions, in accordance with an embodiment of the invention.

Therefore, in accordance with an embodiment of the invention, a sequence of processing steps for the fabrication of a silicon-germanium heterojunction bipolar transistor is shown in FIGS. 7–13. Referring initially to FIG. 7, an active area 110 for a transistor device is defined in a silicon substrate 112. The active area 110 is positioned between shallow trench isolation (STI) areas 114 and silicon film layers 116 to define a bipolar cavity 118.

Figure 8:
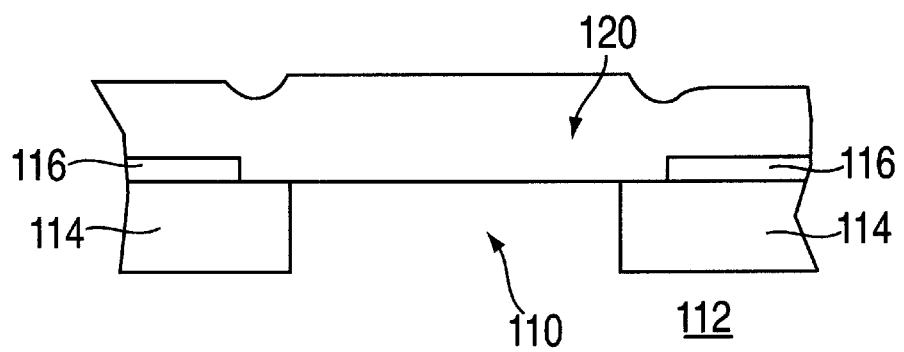
FIG. 8 illustrates the deposition of a collector layer upon the active area shown in FIG. 7.

As shown in FIG. 8, a first low-temperature epitaxial silicon layer 120 is then deposited, completely overfilling the bipolar cavity 118 and overlying the silicon films 116. The first low-temperature epitaxial silicon layer 120 may be deposited by chemical vapor deposition, such as by ultra-high vacuum chemical vapor deposition (UHV-CVD) or other suitable deposition means. Eventually, the collector region of the HBT transistor will be defined therein.

Figure 9:
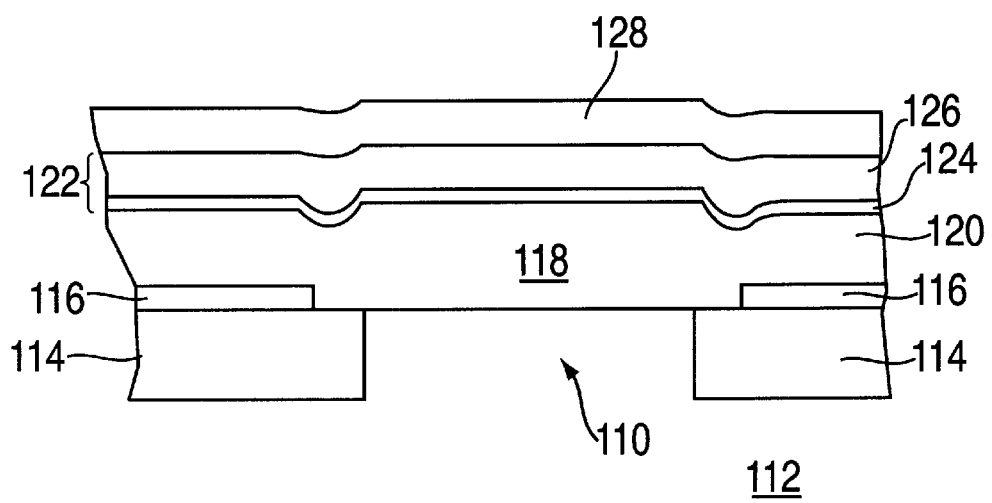
FIG. 9 illustrates the deposition of oxide and nitride layers thereupon.
Figure 10:
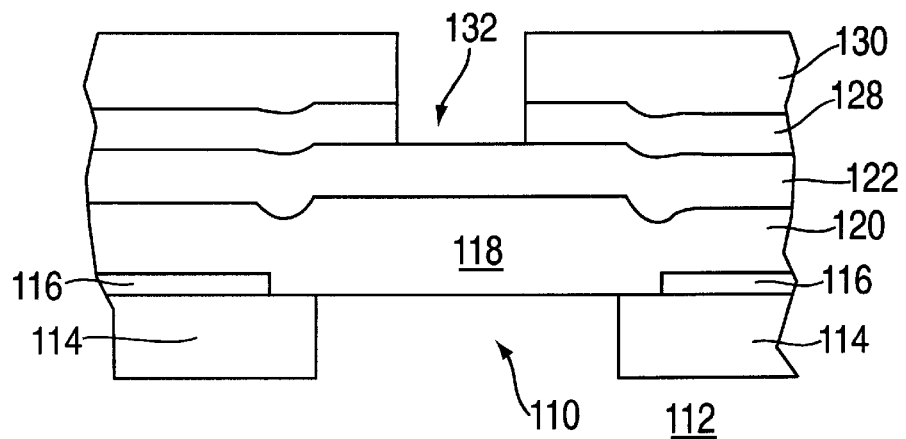
FIG. 10 illustrates the formation of an emitter cavity within the nitride layer shown in FIG. 9 and a photoresist layer.
Figure 11:
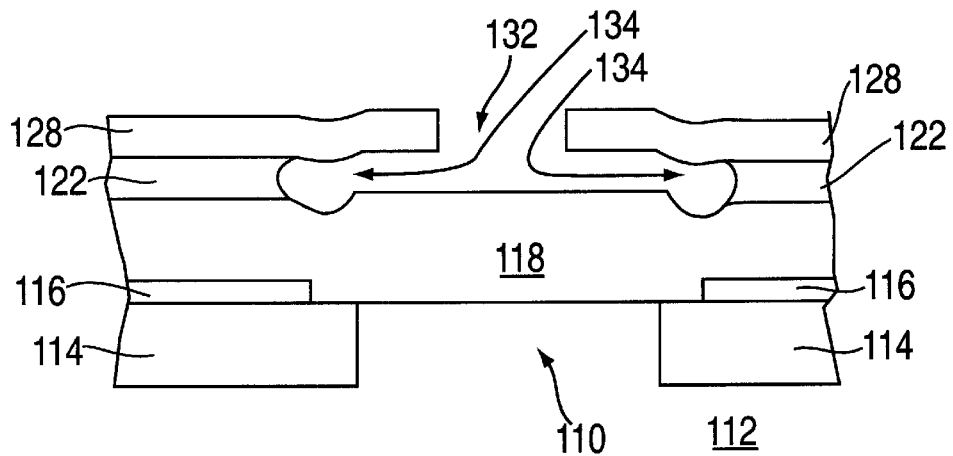
FIG. 11 illustrates the formation of a base cavity within the oxide layer.

FIGS. 9 through 11 illustrate the formation of base and emitter cavities (or openings), prior to the actual deposition of a SiGe base layer. Referring specifically to FIG. 9, an oxide stack 122 is deposited upon the first low-temperature epitaxial silicon layer 120. The oxide stack 122 may comprise a single oxide layer or, alternatively, a plurality of oxide layers. For example, the oxide stack 122 could comprise one or more high pressure oxidation (HIPOX) layers 124, alternated with one or more tetraethoxysilane (TEOS) layers 126, such as may be applied by low pressure plasma enhanced (LP/PE) techniques.

The oxide stack 122 will eventually be etched out to form the base cavity that will contain the SiGe base layer. Therefore, the thickness of the oxide stack 122 is at least as thick as the desired thickness of the base layer, which may range from about 50 to 500 angstroms. Preferably, the thickness of the oxide stack is about 75 to 125 angstroms and, even more preferably, about 100 angstroms.

A silicon nitride layer 128 is then deposited over the oxide stack 122. The silicon nitride layer 128 has a thickness of about 1 to 10 times the thickness of the oxide stack 122, and preferably about 3 to 7 times the thickness of the oxide stack 122. Most preferably, the silicon nitride layer 128 is about 5 times the thickness of the oxide stack 122. Thus, if the oxide stack 122 is chosen to be about 100 angstroms thick, then the silicon nitride layer 128 is about 500 angstroms thick. The silicon nitride layer 128 may be deposited by chemical vapor deposition techniques, such as low pressure chemical vapor deposition (LPCVD), plasma-enhanced chemical vapor deposition (PECVD), or high density plasma chemical vapor deposition (HDP-CVD) techniques. Both the oxide stack 122 and silicon nitride layers 128 are insulating layers.

Referring now to FIG. 10, a resist pattern 130 is positioned over the silicon nitride layer 128, using photolithography techniques. The resist pattern 130 is used to define and etch an emitter cavity 132 within the silicon nitride layer 128. A vertically oriented type etching technique, such as a reactive ion etch (RIE), may be utilized to form cavity 132. After the formation of the emitter cavity 132, the first low-temperature epitaxial silicon layer 120 (collector region) may then be doped, by ion implantation directly through the oxide stack 122.

Next, as shown in FIG. 11, the resist pattern 130 is removed and the oxide stack 122 is thereafter etched away by a wet etching or any other non-directional etching process, so as to form a base cavity 134. It will be noted that the wet etch will "over-etch" and thereby extend laterally beyond the width of the emitter cavity 132, and underneath silicon nitride layer 128, such that the resulting base cavity 134 is wider than the emitter cavity 132. The base cavity 134 will be filled with (and therefore define the dimensions of) the base layer material. The extent to which the base cavity 134 is etched wider than the emitter cavity 132 is determined to be in accordance with the desired extent of the extrinsic base area.

The wet etch may be performed with a chemical such as with a buffered hydrofluoric acid (BHF) solution (about 40:1) or other suitable etch that provides a suitable degree of oxide to nitride selectivity according to the degree of over-etching desired. In this manner, base cavity 134 can be created, while at the same time maintaining the integrity of the emitter cavity 132 geometry within the silicon nitride layer 128.

Figure 12:
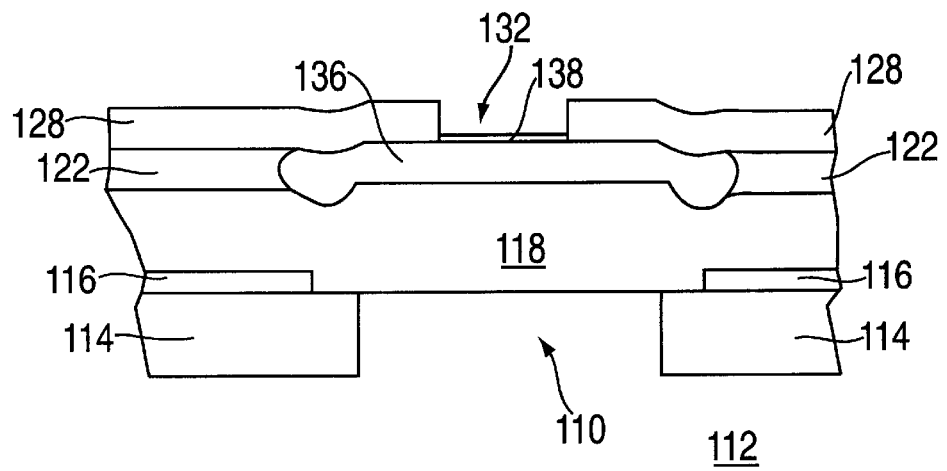
FIG. 12 illustrates the formation of a base layer within the base cavity shown in FIG. 11.

Referring now to FIG. 12, a silicon-germanium (SiGe) base layer 136 is then grown epitaxially in base cavity 134, thereby defining a low-temperature silicon-germanium epitaxial layer 136. During the growth of the low-temperature silicon-germanium epitaxial layer 136 within the base cavity 134, it is expected that some overflow of silicon-germanium up into the emitter cavity 132 may occur. The deposition of SiGe into the base cavity 134 may be carried out by chemical vapor deposition techniques, such as low pressure chemical vapor deposition (LPCVD), ultra high vacuum chemical vapor deposition (UHV-CVD), plasma-enhanced chemical vapor deposition (PECVD), or high density plasma chemical vapor deposition (HDP-CVD).

Preferably, the emitter deposition technique used is selected in a manner so as to induce a low temperature epitaxy (LTE) of the SiGe material within the base cavity 134. Because SiGe growth at LTE temperatures and pressures displays a substantial nucleation lag over oxides and nitrides, while simultaneously providing significant SiGe growth rates over crystalline silicon, the SiGe growth and profile in the base cavity 134 underneath the silicon nitride layer 128 overhang is substantially identical to that directly under the emitter cavity 132. Thus, it will be appreciated that the growth of the SiGe base layer 136 may be delayed until after the formation of the oxide and nitride layers, as well as after the doping of the collector region. Once formed, the base layer 136 then is doped, preferably with boron grown in situ. The base layer 136 is then provided with an intrinsic silicon cap 138. Because of the nucleation lag, there is little or no growth of the SiGe base layer 136 on the emitter cavity 132 sidewalls.

Figure 13:
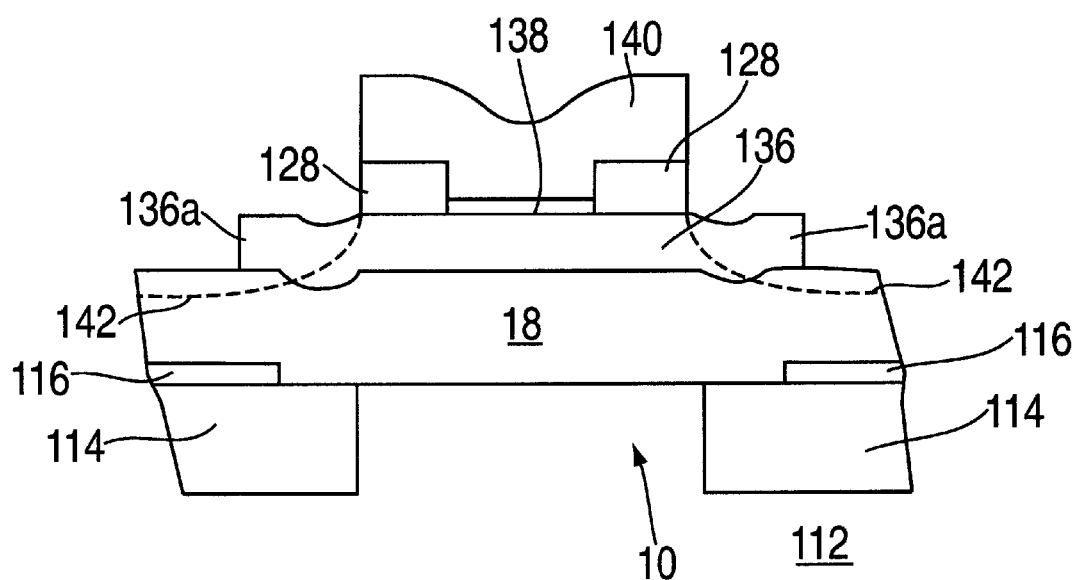
FIG. 13 illustrates the formation of an emitter layer and the doping of an extrinsic base.

Finally, as illustrated in FIG. 13, a polysilicon layer is deposited into the emitter cavity 132 so as to form the emitter 140. The deposition of the emitter 140 may overflow the emitter cavity 132 and blanket a portion of the surrounding silicon nitride layer 128. Portions of the emitter 140, nitride layer 128 and oxide layer 126 are then etched away so as to expose an extrinsic base 136a. The extrinsic base 136a is further shaped by lithography and then doped with boron or boron difluoride, as shown in FIG. 13 by dotted lines 142.

By forming the base cavity 134 and depositing the base layer 136 after the formation of the HIPOX, TEOS and silicon nitride layers, the base layer 136 is not exposed to the thermal cycles resulting therefrom. Furthermore, the collector implantation is not performed through the boron doped base layer 136, but rather is performed before the base layer 136 is even deposited. Therefore, there is a substantially reduced boron diffusion during the manufacturing process and, accordingly, a production of a low basewidth device.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for fabricating a transistor, the method comprising:

forming a collector region upon a substrate;

forming an insulating layer upon said collector region;

defining an opening within a portion of said insulating layer;

forming a cavity within another portion of said insulating layer, said cavity extending laterally beyond a width of said opening;

forming a base region within said cavity; and depositing a polysilicon layer within said opening, said polysilicon layer defining an emitter region.

2. The method of claim 1, wherein said base region further comprises a silicon-germanium layer grown within said cavity.

3. The method of claim 2, wherein forming said insulating layer further comprises:

forming an oxide stack upon said collector region; and forming a nitride layer upon said oxide stack.

4. The method of claim 2, further comprising:

ionically implanting a collector dopant material into said collector region, prior to growing said silicon germanium layer within said cavity.

5. The method of claim 2, further comprising:

forming extrinsic base regions, said extrinsic base regions comprising areas of said base region which extend laterally beyond said width of said opening, said extrinsic base regions being formed by removing portions of said insulating layer.

6. The method of claim 5, father comprising: ionically implanting a base dopant material into said base region, following the formation of said extrinsic base regions.

7. The method of claim 6, wherein said base dopant material is boron.

8. The method of claim 2, wherein said cavity is formal in said insulating layer through a wet chemical etch.

9. The method of claim 8, wherein said wet chemical etch is performed with a buffered hydroflouric acid solution.

10. The method of claim 3, wherein said oxide stank further comprises:

at least one high pressure oxidation (HIPOX) layer; and at least one tetraethoxysilane (TEOS) layer.

11. A method for fabricating a heterojunction bipolar transistor having collector, base and emitter regions, the method comprising;

forming a silicon epitaxial layer upon a substrate, said silicon epitaxial layer defining the collector region;

forming an oxide stack upon said silicon epitaxial layer;

forming a nitride layer upon said oxide stack;

defining an emitter opening within said nitride layer;

forming a base cavity within said oxide stack, said base cavity extending laterally beyond a width of said emitter opening;

growing a silicon-germanium epitaxial layer within said base cavity, said silicon-germanium epitaxial layer defining the base region; and depositing a polysilicon layer upon said silicon-germanium epitaxial layer, said polysilicon layer defining the emitter region.

12. The method of claim 11, wherein said base cavity is formed after said oxide stack and said nitride layer have been formed.

13. The method of claim 11, further comprising;

ionically implanting a collector dopant material into the collector region, prior to growing said silicon germanium epitaxial layer within said base cavity.

14. The method of claim ii, farther comprising:

forming extrinsic base regions, said extrinsic base regions comprising areas of the base region which extend laterally beyond said width of said emitter opening, said extrinsic base regions being formed by removing portions of said oxide stack and said nitride layer.

15. The method of claim 14, further comprising:

ionically implanting a base dopant material into the base region, following the formation of said extrinsic base regions.

16. The method of claim 15, wherein said base dopant material is boron.

17. The method of claim 12, wherein said base cavity is fanned in said oxide stack through a wet chemical etch.

18. The method of claim 17, wherein said wet chemical etch is performed with a buffered hydroflouric acid solution.

19. The method of claim 11, wherein said oxide stack further comprises:

at least one high-pressure oxidation (HIPOX) layer; and at least one tetraethoxysilane (TEOS) layer.

20. The method of claim 19, wherein said oxide stack is about 50 to 500 angstroms in thickness.

21. The method of claim 19, wherein said oxide stack is about 75 to 125 angstroms in thickness.

22. The method of claim 19, wherein said oxide stack P about 100 angstroms in thickness.

23. The method of claim 20, wherein said nitride layer is about 1 to 10 times the thickness of said oxide stack.

24. The method of claim 21, wherein said nitride layer is about 3 to 7 times the thickness of said oxide stack.

25. The method of claim 22, wherein said nitride layer is about 5 times the thickness of said oxide stack.

* * * * *